United States Patent
Cassagnes et al.

(10) Patent No.: US 12,080,857 B2
(45) Date of Patent: Sep. 3, 2024

(54) SYSTEMS AND METHODS INVOLVING MEASUREMENT OF BATTERY CELLS

(71) Applicant: NXP USA, INC., Austin, TX (US)

(72) Inventors: Thierry Dominique Yves Cassagnes, Tournefeuille (FR); Jérôme Dietsch, Lavernose-Lacasse (FR); Thomas Mallard, Toulouse (FR)

(73) Assignee: NXP USA, Inc., Austin, TX (US)

( * ) Notice: Subject to any disclaimer, the term of this patent is extended or adjusted under 35 U.S.C. 154(b) by 493 days.

(21) Appl. No.: 17/021,284

(22) Filed: Sep. 15, 2020

(65) Prior Publication Data

US 2021/0126295 A1    Apr. 29, 2021

(30) Foreign Application Priority Data

Oct. 23, 2019 (EP) ..................... 19306373

(51) Int. Cl.
  *H01M 10/42* (2006.01)
  *H01M 10/04* (2006.01)
(52) U.S. Cl.
  CPC ... *H01M 10/4257* (2013.01); *H01M 10/0413* (2013.01); *H01M 2010/4271* (2013.01)
(58) Field of Classification Search
  CPC .............................................. H01M 10/4257
  See application file for complete search history.

(56) References Cited

U.S. PATENT DOCUMENTS

| | | | |
|---|---|---|---|
| 7,696,725 B2 | 4/2010 | Liu et al. | |
| 8,922,165 B2 | 12/2014 | Bills | |
| 9,746,525 B2 | 8/2017 | Kudo et al. | |
| 9,774,206 B2 | 9/2017 | Kim et al. | |
| 2010/0090653 A1 | 4/2010 | Kuwano et al. | |
| 2012/0139553 A1* | 6/2012 | Nortman | H02J 9/002 324/126 |
| 2013/0026994 A1 | 1/2013 | Morikawa | |
| 2014/0253135 A1 | 9/2014 | Eguchi et al. | |
| 2015/0022213 A1 | 1/2015 | Chandler et al. | |

FOREIGN PATENT DOCUMENTS

EP   3327455 A1   5/2018

OTHER PUBLICATIONS

"NXP Customer Information Notification—MC33771A Data Sheet Update Rev 8.0", Apr. 13, 2018, pp. 1-2, retrieved from the internet at https://www.mouser.com/catalog/additional/NXP_2018020101.pdf on Apr. 8, 2020, 198 pages.

* cited by examiner

*Primary Examiner* — Brian R Ohara

(57) ABSTRACT

A multi-cell battery apparatus is provided, according to certain aspects, including a battery with a plurality of voltage-stacked battery cell circuits, a switchable resistive-divider circuit and a control circuit. The control circuit selectively activates the switchable resistive-divider circuits and, in response to the respective switchable resistive-divider circuits being selectively activated, the control circuit measures the controlled-load voltage drops. These aspects are used to allow open load detection without interfering with the cell balancing mechanism and the accuracy of the redundant measurements performed on these pins in a battery management system.

13 Claims, 3 Drawing Sheets

SYSTEMS AND METHODS INVOLVING MEASUREMENT OF BATTERY CELLS

OVERVIEW

Aspects of various embodiments are directed to open load detection of cell balancing in a battery management system (BMS) and, in some instances, to permit such measurement with a redundant measurement capability.

A BMS measures and reports important information for the operation of a battery pack, and may protect the battery pack from damage across a range of operating conditions. Such a BMS can balance multiple batteries in the battery pack and can eliminate mismatches of cells in a series or parallel combinations to substantially improve battery efficiency and increase overall capacity of a battery having an arrangement of stacked cells. For increasing the number of stacked cells and related load currents in a battery, the potential for mismatch increases for two types of mismatch—state of charge mismatch and the less-common capacity/energy mismatch. Both types of mismatch limit the battery stack capacity (mAh) to the capacity of the weakest cell.

A BMS may use measurement channels and may use cell balancing pins to perform such measurements. An integrated circuit (IC) chip for a BMS may allow two main functions. One function may be to perform accurate measurements of the battery cells (or battery/cell elements). Another function may be to allow the discharge of the cells so that their respective levels may be accurately controlled. This action is called cell balancing. The duration of battery functionality for multiple cells may be extended through cell balancing.

Cell balancing is sometimes referred to as a state in which the stacked cells of a battery are balanced, such that all of the cells in the battery stack are in compliance with the following two conditions. First, if all cells have the same capacity, the cells are balanced when all of them have the same state of charge. Open circuit voltage is an accurate indication of the state of charge. Second, cells with different capacities can be considered to be balanced when the state of charge is the same for all of the cells.

Cell balancing consists of drawing from the cells, a large current through a resistor (cell balancing resistor). For power dissipation reasons, the resistor may be external to the IC, and a control switch for its enabled use may be internal.

As a common requirement, BMS IC chips may be able to diagnose whether connections to external applications are properly in place. An open load detection (OLD) scheme is one exemplary approach which may be used to check that cell balancing pins are properly connected to the battery cells.

SUMMARY

Various example embodiments are directed to issues such as those addressed above and/or others which may become apparent from the following disclosure concerning performance of open load detection of cell balancing in a BMS.

In certain example embodiments, aspects of the present disclosure involve an OLD scheme that allows diagnosis regarding whether connections in a system to external applications are properly in place and whether cell balancing pins in a system are properly connected to battery cells.

In a more specific example embodiment, a multi-cell battery apparatus may include a plurality of voltage-stacked battery cell circuits, and a control circuit. The plurality of voltage-stacked battery cell circuits may include: a battery cell having an upper voltage terminal and a lower voltage terminal, and a switchable resistive-divider circuit having an input node disposed between the upper voltage terminal and the lower voltage terminal, for providing an output corresponding to a controlled-load voltage drop relative to the charge of each of the cell circuits. The control circuit may selectively activate the switchable resistive-divider circuits and, in response to the respective switchable resistive-divider circuits being selectively activated, measure the controlled-load voltage drops.

In one or more example embodiments, each of the plurality of voltage-stacked battery cell circuits may further include a selectively activatable battery cell bias circuit to bias a cell output voltage across the upper voltage and lower voltage terminals and to equalize one of the plurality of voltage-stacked battery cell circuits relative to other of the plurality of voltage-stacked battery cell circuits.

In one or more example embodiments, the control circuit may be configured to periodically activate each of the switchable resistive-divider circuits and, in response, to measure and report voltage deviations beyond a certain threshold.

In one or more example embodiments, each of the switchable resistive-divider circuits may include two pairs of interconnected resistive-dividers cooperatively arranged to provide the controlled-load voltage drop.

In one or more example embodiments, each of the switchable resistive-divider circuits may include two pairs of interconnected resistive-dividers to provide, via respective high-impedance paths, the controlled-load voltage drop, and each of the respective high-impedance paths may include an upper-voltage resistive circuit to provide a first amount of resistance and a lower-voltage resistive circuit to provide another amount of resistance which differs from the first amount by at least an order of magnitude.

In one or more example embodiments, each of the switchable resistive-divider circuits may include a field-effect transistor and may include two pairs of interconnected resistive-dividers to provide the controlled-load voltage drop, wherein the control circuit may be configured to selectively activate the field-effect transistor and in response, enable each of the switchable resistive-divider circuits to permit for measurement of the controlled-load voltage drop.

In one or more example embodiments, the plurality of voltage-stacked battery cell circuits collectively may be configured to provide a large cell balancing current path for circulating current between one of a multiple primary load terminals to another of the multiple primary load terminals, and the control circuit may be configured to periodically activate each of the switchable resistive-divider circuits without causing non-negligible resistance to be added to the large cell balancing current path.

In one or more example embodiments, the control circuit may be configured to periodically activate each of the switchable resistive-divider circuits and, in response, to measure and report voltage deviations beyond a certain threshold, and in response to the control circuit periodically activating one of the switchable resistive-divider circuits, current drawn from an associated battery cell circuit may be sufficiently small to avoid introducing error in the measured voltage deviations.

In one or more example embodiments, the control circuit may be configured to periodically activate each of the switchable resistive-divider circuits and, in response, to measure and report voltage deviations beyond a certain threshold, and for each pair of consecutive battery cells of the voltage-stacked battery cell circuits, there is no shared common cell battery pin. In one or more example embodiments, the control circuit may be configured to periodically activate each of the switchable resistive-divider circuits and, in response, to measure and report voltage deviations beyond a certain threshold, and in response to each of the switchable resistive-divider circuits not being activated, the upper voltage terminal and the lower voltage terminal may be configured to indicate an open load detection mode through which the control circuit may be configured to confirm, in absence of the control circuit detecting voltage deviations beyond a certain threshold, integrity of the respective voltage-stacked battery cell circuit.

In one or more example embodiments, each of the voltage-stacked battery cell circuits may further include a pair of primary cell terminals coupled to the upper voltage and the lower voltage terminals through respective high-impedance paths, and may further include a pair of secondary cell terminals coupled to the upper voltage and the lower voltage terminals through respective high-impedance paths and further coupled to an associated switchable resistive-divider circuit, respectively, wherein in response to an associated one of the switchable resistive-divider circuits not being activated, the pair of secondary cell terminals may be configured to provide a voltage level which is lower than a voltage level of the pair of primary cell terminals to indicate a normal operation mode.

In one or more example embodiments, the multi-cell battery apparatus may further include cell terminal pins, and the plurality of voltage-stacked battery cell circuits and the control circuit may be configured to provide open load detection at the cell terminal pins, wherein the apparatus may further include a common cell battery pin shared by each two consecutive battery cells of the voltage-stacked battery cell circuits, and wherein the plurality of voltage-stacked battery cell circuits and the control circuit may be configured to provide an indication in response to an automatic self-diagnosis of open load detection status at cell terminal pins. In another specific example embodiment, for use with a multi-cell battery apparatus in which each of a plurality of voltage-stacked battery cell circuits includes a battery cell and a switchable resistive-divider circuit to output a controlled-load voltage drop, a method may be performed. The method may comprise: selectively activating the switchable resistive-divider circuits; and measuring the controlled-load voltage drop in response to the respective switchable resistive-divider circuits being selectively activated.

In one or more example embodiments, the method may further include biasing a cell output voltage across the upper voltage and lower voltage terminals and equalizing the voltage-stacked battery cell circuit relative to other of the plurality of voltage-stacked battery cell circuits.

In one or more example embodiments, the method may further include periodically activating each of the switchable resistive-divider circuits and, in response, generating outputs indicative of measured voltage deviations being beyond a certain threshold.

In one or more example embodiments, the switchable resistive-divider circuit may include two pairs of interconnected resistive-dividers cooperatively arranged to provide the controlled-load voltage drop, and the method may further include:
periodically activating each of the switchable resistive-divider circuits,
measuring or comparing voltage deviations relative to a certain threshold, and
reporting in response to measured or compared voltage deviations beyond the certain threshold.

In one or more example embodiments, for each pair of consecutive battery cells of the voltage-stacked battery cell circuits, there may be no shared common cell battery pin.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
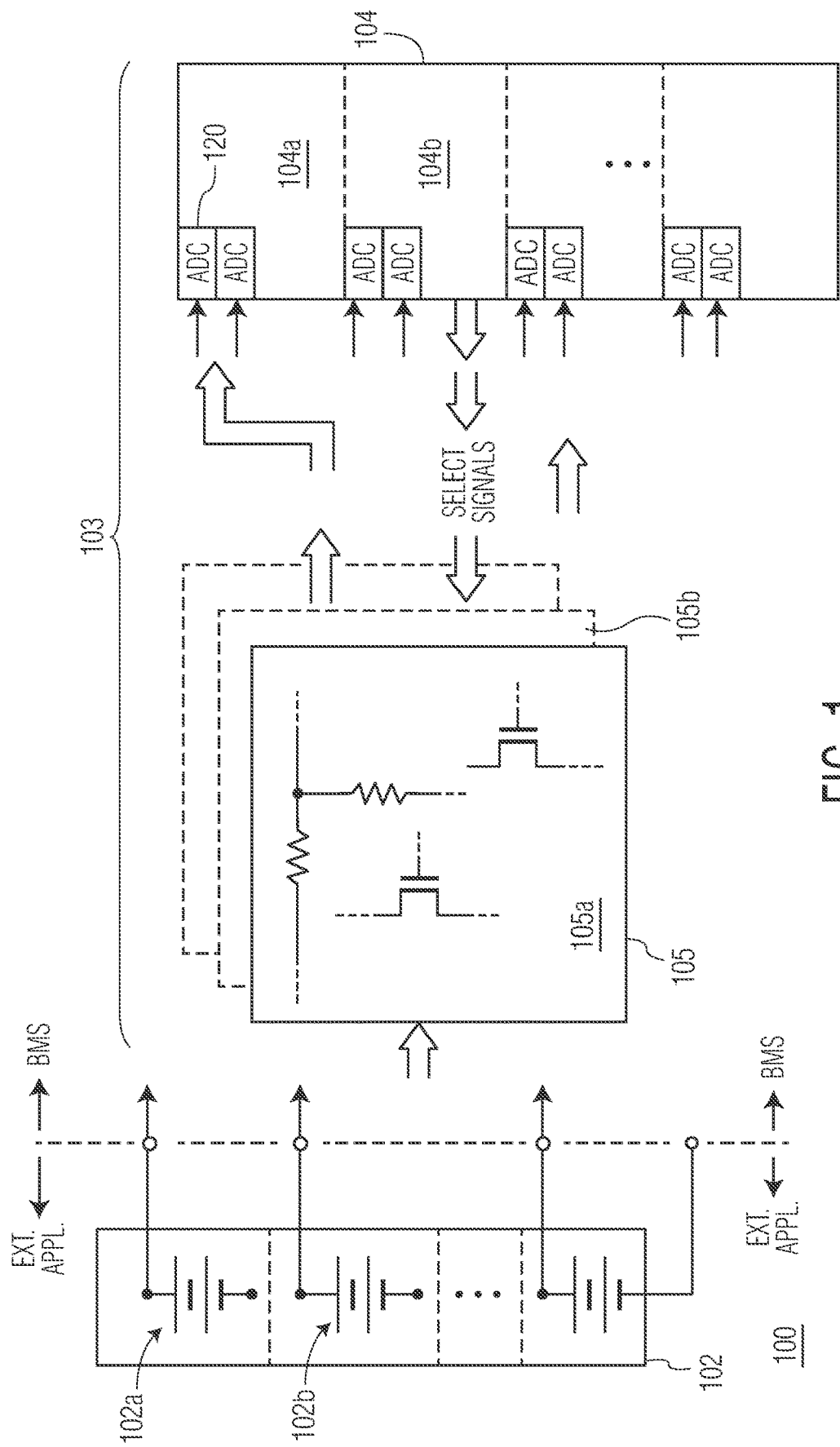
FIG. 1 is a schematic circuit diagram depicting an example embodiment, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving performance of open-load detection (OLD) of charge at each cell of a battery for cell balancing in a BMS. In certain specific implementations, aspects of the present disclosure have been shown to be beneficial when used in such an example context of a car battery system, for example, employing an OLD scheme. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination. Embodiments as characterized herein may be implemented in accordance with a variety of different illustrative types of systems and methods in battery management applications, for example in battery operated equipment, automotive high voltage battery management systems, electric vehicle battery systems, high voltage battery management systems (HVBMS), battery operated industrial equipment, handheld battery operated equipment, electric power commercial battery backup systems, lithium ion cell balancing circuits, and the like. For instance, one or more of the aspects of the disclosure may be implemented in the context of a car battery system having an automotive safety integrity level (ASIL) of D grade, for example, which includes the highest degree of automotive hazard.

One or more of the above example applications, in accordance with the present disclosure, may be facilitated by employing open-load detection for cell balancing in connection with a BMS, optionally with redundant measurement capability for the associated cells. The system may, for example, include, a multi-cell battery apparatus that may include a plurality of voltage-stacked battery cell circuits, and a control circuit. The plurality of voltage-stacked battery cell circuits may include a battery cell having an upper voltage terminal and a lower voltage terminal, and a switchable resistive-divider circuit having an input node disposed between the upper voltage terminal and the lower voltage terminal, for providing a controlled-load voltage drop relative to the charge of each cell circuit. The control circuit may selectively activate the switchable resistive-divider circuits and, in response to the respective switchable resistive-divider circuits being selectively activated, to measure the controlled-load voltage drops.

Other embodiments are directed to methods for use with a multi-cell battery apparatus in which each of a plurality of voltage-stacked battery cell circuits includes a battery cell having an upper voltage terminal and a lower voltage terminal and includes a switchable resistive-divider circuit to output a controlled-load voltage drop. The method further includes: selectively activating the switchable resistive-divider circuits; and, measuring the controlled-load voltage drop in response to the respective switchable resistive-divider circuits being selectively activated.

Turning now to the figures, FIG. 1 is a schematic-like circuit diagram depicting an embodiment of an electronic circuit 100 for managing a battery 102, having stacked (e.g. voltage-stacked) cell circuits or "cells" 102a, 102b, etc., in a manner that enables and/or diagnoses cell balancing. The illustrative electronic circuit 100 comprises a battery management system (BMS) IC 103 having a control circuit (e.g., logic or microcomputer circuitry) 104 configured for monitoring and/or managing the stacked cell through a voltage reduction circuit 105. The voltage reduction circuit 105 is coupled to the battery 102 for selectively monitoring each of the cells 102a, 102b, etc. The selectivity is realized by using the control circuit 104 to selectively activate circuitry within the voltage reduction circuit 105 for passing energy and measuring controlled-load voltage drops associated with each of the cells 102a, 102b, etc. through switchable resistive-divider circuits within the voltage divider circuit 105. FIG. 1 is shown to include some other optional aspects/features which would be recognized as facilitating different ways for implementing. For example, for processing energy associated with the cells 102a, 102b, etc., the BMS IC 103 has both the control circuit 104 and the voltage reduction circuit 105 depicted cell-specific circuit sections shown in dotted lines. In the control circuit 104, these sections are shown as 104a, 104b, etc. In the voltage reduction circuit 105, these sections are shown as 105a, 105b, etc. Each of the cell-specific circuit sections may be associated with a respective one of the cells 102a, 102b, etc., as indicated by the letter ("a" or "b") appended to each reference numeral. Accordingly, the control circuit 104 may selectively activate the sections 105a, 105b, etc. of the voltage reduction circuit 105, via output nodes respectively associated therewith, to measure the controlled-load voltage drops. Also, as there are a variety of different ways to implement the voltage reduction circuit 105, for illustrative purposes, the voltage reduction circuit 105 is shown to include example (nonlimiting) circuits in the form of impedance components (e.g., resistors) and switches (e.g., transistors), the latter of which may have control-signal (e.g., gate) inputs coupled to output nodes of the control circuit 104. Further, it would be appreciated that one or more parts of the BMS IC 103 may be included and implemented as part an integrated circuit chip (or chip set) and, in one such example context which depends on the implementation, the control circuit 104 and the voltage reduction circuit 105 may (or may not) be included and implemented as part the same integrated circuit chip (or chip set).

Accordingly, example circuits consistent with the present disclosure may be used to allow for performance of open-load detection (OLD) via selective control (via input/output signals) provided by a control circuit which is coupled to such a voltage reduction circuit. In this regard, the control circuit (and optionally the voltage reduction circuit) may feature cell balancing pins as part of a battery management system (BMS) without causing interference with accuracy of measurements made via other aspects of the BMS. For example, as is common with previous BMS features, primary measurements of the charge at each cell may be obtained independently of and without adverse effect due to the above-characterized voltage reduction circuit even though such a voltage reduction circuit is coupled directly to the cell circuitry. By the control circuit's selective activation, such primary measurements may be performed without degrading diagnosis. Moreover, such primary measurements and the selective operations/activations of the control circuit and the voltage reduction circuit may run in parallel so as to provide redundant measurements.

Various other important advantages of the instant disclosure may be recognized by highlighting certain attributes of the above-described circuit-based building blocks of the type of system disclosed herein. One such advantage and feature of the instant disclosure is that the system may permit for self-diagnosis, to ensure proper operation even when no open load may be detected. Another such advantage is that no resistor may be required in a path of a large cell balancing current. Such a resistor could limit maximum balancing current and could cause additional thermal dissipation in a BMS integrated chip (IC) or chip set. Another advantage is that while OLD detection is active in a case in which there is no open load, a switch in the switchable resistive-divider circuit may be activated/enabled, and there is no adverse current draw pulled from the associated cell of the battery. Such drawn current is sufficiently low that voltage drop caused though a battery connector (or battery-terminal connector) does not create a significant error on a primary measurement. A further advantage in this regard is that additional circuitry for open load diagnosis may be readily implemented so as not to degrade redundant (secondary) measurement accuracy. When an open load condition is present, measurements taken on the cell balancing pins (redundant or second measurement) may be 0V, or at least a low value. When no open load is present (such as in a normal operation case), the secondary measurement as discerned through the cell/channel leading to the analog-to-digital converter (ADC) in the control circuit (e.g., ADC 120 of 104 in FIG. 1) may indicate a lower voltage versus the primary measurement. Accordingly, verification that the OLD mechanism is properly working may be facilitated.

Figure 2:
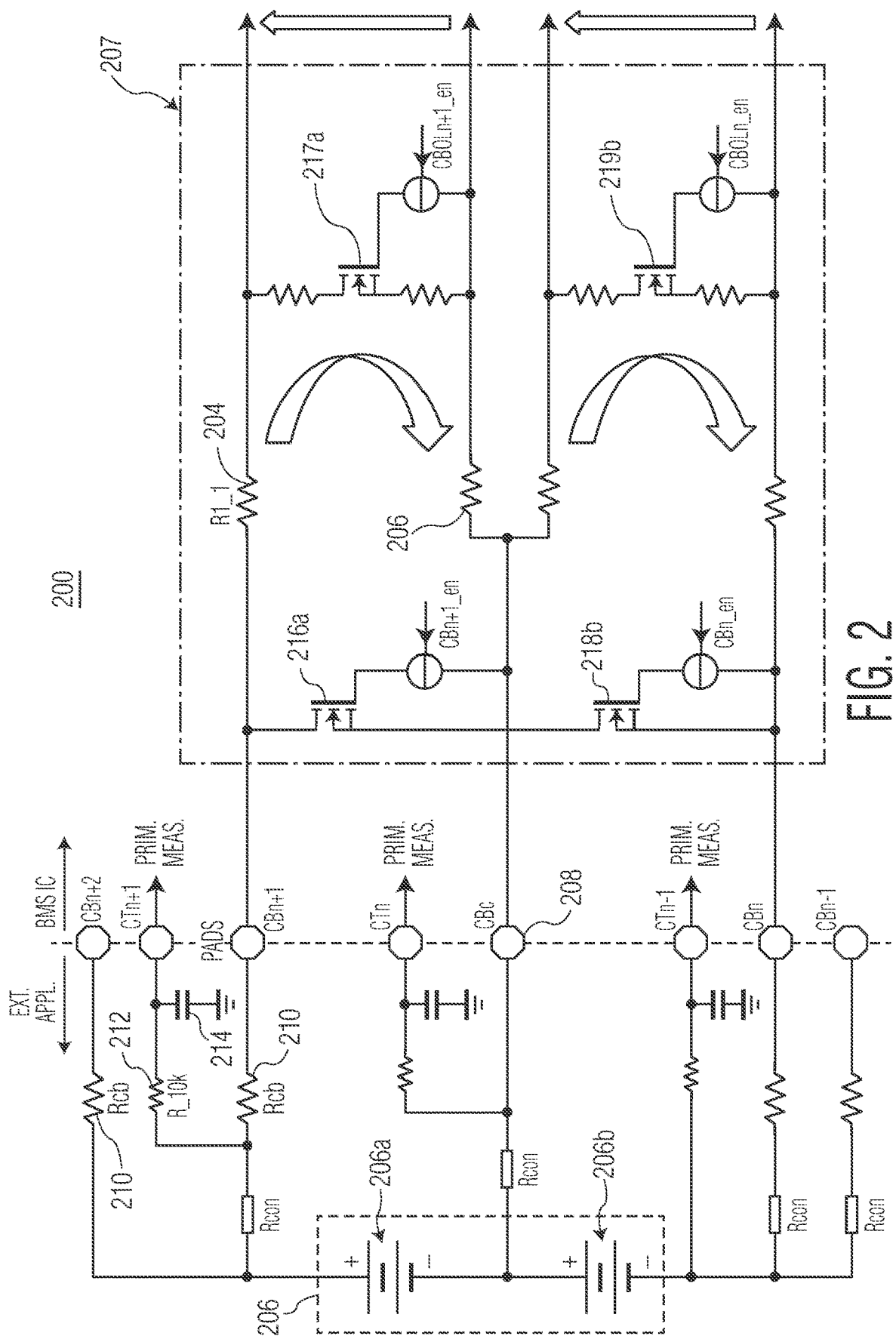
FIG. 2 is a schematic circuit diagram depicting a related more-specific embodiment, in accordance with another example of the present disclosure.

FIG. 2 schematically shows another example circuit diagram relating to the above-discussed aspects of FIG. 1. Consistent with the example embodiment of FIG. 1, the more-specific example embodiment of FIG. 2 shows a battery 206 characterized in this example by a two voltage-stacked battery cells 206a, 206b (noting that more cells may be used in this regard), and showing cell charge provided by the battery 206 with a switchable resistive-divider circuit 207 arranged for facilitation of monitoring via a control circuit (not shown in FIG. 2 but such as shown in FIG. 1 as 104). In this diagram of FIG. 2, there is a common cell battery (CB) pin 208 shared by the two consecutive cells (or each two consecutive cells in the case of a battery having more than two stacked cells), and due to the common cell battery (CB) pin 208, the balancing current is always equal to Vcell/Rcb regardless of which cells are selected (where Vcell equals voltage provided at each respective cell and Rcb equals resistance 210 connecting to the upper terminal of the respective cell in each of the external and internal paths). As with the circuitry depicted in FIG. 1, the switchable resistive-divider circuit 207 of FIG. 2 is arranged to output a controlled-load voltage drop relative to the upper voltage terminal and the lower voltage terminal, and is arranged to selectively activate switches 216a, 217a (for cell 206a) and 218b, 219b (for cell 206b) and, in response, measure the controlled-load voltage drops via open-load detection selectively for each respective cell 206a and 206b. As ideal cell balancing ensures a constant balancing current regardless of the combination of cells that are selected, in connection with the implementation of FIG. 2 which is yet another cell balancing architecture. In a specific type of example corresponding to the system and circuitry of FIG. 2, the CB pin 208 is present for every pair of consecutively-arranged cells as may be used in the cell-stacked battery. The CB 208, for each such cell, is used as a current return path common to two consecutive cells, which may be advantageous for applications which require assurance of a balancing current regardless of which cells may be selected for OLD measurement in such battery systems.

In the example embodiment of FIG. 2 it may be appreciated in the contexts of three different cases of operation relative to open-load detection involving the switchable resistive-divider circuit 207 as may be controlled by a control circuit (not shown in FIG. 2). A first case includes measurement accuracy when the circuit 207 is not enabled by the control circuit (not illustrated in FIG. 2). For instances in which the circuit 207 may be enabled by the control circuit for possible open-load detection, a second case includes an open-load detection diagnosis result when there is no open load condition, and a third case includes open-load detection diagnosis when there is an open load condition.

Applicable to each of these cases: FIG. 2 shows a battery connector connecting to each such cell is denoted as Rcon; each of various current-providing switches/sources in the circuit 207 (for gate control over the switches 216a, 217a, 218b and 219b) depicted as a circle with a horizontal line in the circle. Also, as nonlimiting examples of impedance component values: the resistor 210 and those vertically aligned therewith (such as the resistor 212) may be 10 k Ohms; the capacitor 214 and those capacitors vertically aligned therewith may be 47 nFarads; the resistors relating to elements 204 and 206 (and those vertically aligned therewith) may be 600 Ohms; and the resistors vertically aligned with the switches 217a and 219b may be 9.4 k Ohms.

With regards to the first case of measurement accuracy in which OLD is disabled, this may occur when the control circuit has its outputs set to cause switches 216a and 218b to be in an off state (nonconductive between source and drain terminals). In this state, the values of resistors 204 and 206 are set to be sufficiently small so that they do not cause any error in secondary measurement results. This follows since the value of resistor 204<<Zin where Zin is the high input impedance of the measurement circuit that is connected to resistor 204 and resistor 206.

In the second case, when OLD may be enabled (e.g., with switch 216a "on") and connections are in place for no open load condition, the measured value on the secondary channel (connecting to resistor 210 for the first cell) may be calculated via Equation 1 as follows using the depicted circuitry relevant to measuring the charge of the first cell:

$$V_{sec\_meas} = V_{cell} \frac{R_2}{R_{cb} + R_1 + R_2}, \quad \text{(Eq. 1)}$$

where $R_1 = R_{1\_1} + R_{1\_2}$ and $R_2 = R_{2\_1} + R_{2\_2}$

In Equation 1, $R_{1\_1}$, $R_{1\_2}$, $R_{2\_1}$ and $R_{2\_2}$ respectively correspond to the resistors shown to be vertically aligned with the switches 217a and 219a. For example, if each of the resistor values $R_1$ and $R_2$ equals 9.4 kOhms, then $V_{sec\_meas}=V_{cell}\times0.94$, which represents a 6% reduction in value of the secondary measurement versus a corresponding primary measurement. Such reduction may be within the resolution of an ADC used in the control circuit for the analog-to-digital conversion of this particular measurement along the (first cell) channel, in the absence of open load. Therefore, this approach is advantageous in that it may inform a user/technician that the OLD mechanism is properly working and that there is no open load condition detected.

The OLD mechanism may also impact the primary measurement. The OLD current may be equal to:

$$I_{OLD} = \frac{V_{cell}}{R_1 + R_2 + R_{cb}} \text{ with } R_{cb} << R_1 + R_2, \quad \text{(Eq. 2)}$$

$$\text{so } I_{OLD} \approx \frac{V_{cell}}{R_1 + R_2}$$

In the case of the example embodiment of FIG. 2, $$I_{OLD\_max} \approx \frac{V_{cell}}{R_1 + R_2} = \frac{5}{20.10^3} = 250 \, uA. \quad \text{(Eq. 3)}$$

Such a current may develop a drop across the battery connectors (1 Ohm each) equal to:

$$V_{drop\_max} \approx \frac{V_{cell}}{R_1 + R_2} \times 2.R_{con} = 250 \, uA \times 2 = 0.5 \, mV \quad \text{(Eq. 4)}$$

Such a voltage is small enough that it may provide integrity of the primary measurement results even if OLD was enabled during accurate primary measurement acquisition. It may be appreciated that this description holds for measurements for both cells of FIG. 2 (in connection with use of both switches 216a and 216b.

In the third case involving an open-load detection diagnosis when there is an open load condition, the CB pins are no longer connected to their corresponding battery element, and consequently the secondary measurement value is 0V. This description also holds for each of the depicted secondary measurements in FIG. 2.

Figure 3:
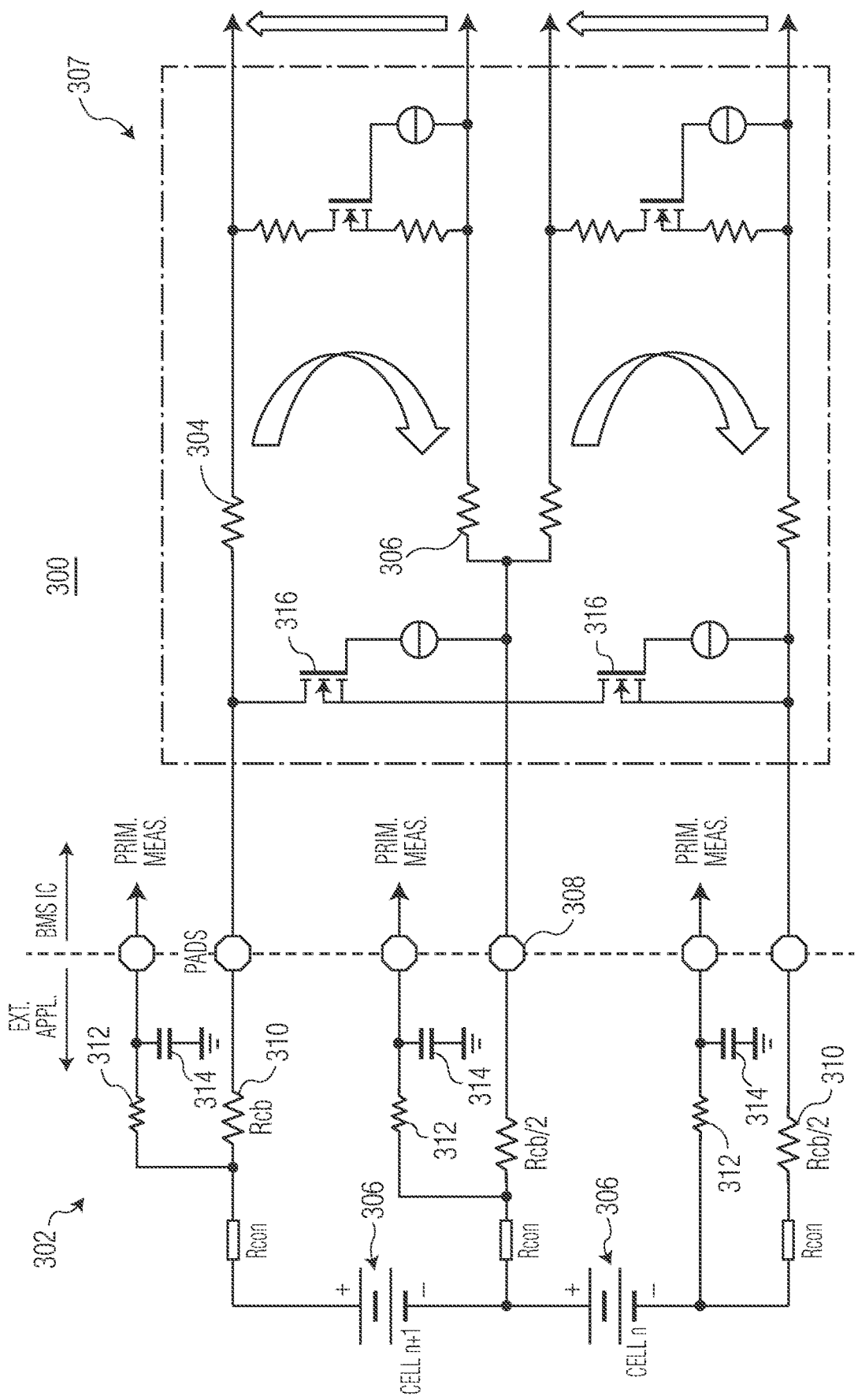
FIG. 3 is a schematic circuit diagram depicting yet another example embodiment, in accordance with the present disclosure.

FIG. 3 is a schematic circuit diagram depicting an example embodiment including cell balancing architecture when a common pin (shared by immediately-adjacent stacked cells as in FIG. 2) is not available. Such an approach does not ensure a constant cell balancing current when several consecutive cells are selected. Nevertheless, the circuit 300 may detect open load conditions, diagnose the OLD system itself, and not interfere with the redundant or secondary measurement accuracy.

Accordingly, the primary difference between the example embodiments depicted in FIGS. 2 and 3 is that in FIG. 3, there is no additional common pin and, therefore, no current return path that is common to two consecutive cells. In other regards, the same types of circuits, elements and values may be used as in FIG. 2. Similar numbering is used for similar components between FIGS. 2 and 3; for example, the switchable resistive-divider circuit 207 in FIG. 2 corresponds to the switchable resistive-divider circuit 307 in FIG. 3. Further, the same description is applicable for each of the three different cases as described in connection with FIG. 2.

Also, in each of the above-described embodiments, a similar method may be used for measuring cell charge, e.g., in connection with cell balancing. In such a method, a controller (e.g., as part of a BMS) may use such a switchable resistive-divider circuit to output a signal reflecting a controlled-load voltage drop at each cell. The method may include selectively activating each of the switchable resistive-divider circuits in series and in each instance, measuring the controlled-load voltage drop in response to the respective switchable resistive-divider circuits being selectively activated.

In another approach, one or more of the above embodiments may offer additional cell-measurement redundancy by using a BMS IC connected to battery cell elements or terminals through measurement pins normally provided in connection with the battery.

In one or more embodiments, a multi-cell battery apparatus is provided, according to certain aspects, including a battery with a plurality of voltage-stacked battery cell circuits (102a, 102b), a switchable resistive-divider circuit (105) and a control circuit (104). The control circuit selectively activates the switchable resistive-divider circuits and, in response to the respective switchable resistive-divider circuits (105) being selectively activated, the control circuit measures the controlled-load voltage drops. These aspects are used to allow open load detection without interfering with the cell balancing mechanism and the accuracy of the redundant measurements performed on these pins in a battery management system.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., see FIGS. 1-3). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1-3. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . "). Among other modifications and changes which may be made, the skilled artisan would also recognize that other nonlimiting examples might use types of transistors that are other than field effect transistors (FETs).

The invention claimed is:

1. A multi-cell battery apparatus comprising:
   a plurality of voltage-stacked battery cell circuits, each including
   a single battery cell having an upper voltage terminal and a lower voltage terminal, and
   a switchable resistive-divider circuit, having an input node disposed between the upper voltage terminal and the lower voltage terminal, to output a controlled-load voltage drop relative to the upper voltage terminal and the lower voltage terminal, wherein the switchable resistive-divider circuit includes two pairs of interconnected resistive-dividers cooperatively arranged to provide the controlled-load voltage drop; and
   a control circuit to selectively activate the switchable resistive-divider circuits and, in response to the respective switchable resistive-divider circuits being selectively activated, to measure the controlled-load voltage drops.

2. The multi-cell battery apparatus of claim 1, wherein each of the plurality of voltage-stacked battery cell circuits further includes a selectively activatable battery cell bias circuit to bias a cell output voltage across the upper voltage and lower voltage terminals and to equalize one of the plurality of voltage-stacked battery cell circuits relative to other of the plurality of voltage-stacked battery cell circuits.

3. The multi-cell battery apparatus of claim 1, wherein the control circuit is to periodically activate each of the switchable resistive-divider circuits and, in response, to measure and report voltage deviations beyond a certain threshold.

4. The multi-cell battery apparatus of claim 1, wherein each of the switchable resistive-divider circuits is configured to provide, via respective high-impedance paths, the controlled-load voltage drop, and wherein each of the respective high-impedance paths includes an upper-voltage resistive circuit to provide a first amount of resistance and a lower-voltage resistive circuit to provide another amount of resistance which differs from the first amount by at least an order of magnitude.

5. The multi-cell battery apparatus of claim 1, wherein each of the switchable resistive-divider circuits includes a field-effect transistor and includes two pairs of interconnected resistive-dividers to provide the controlled-load voltage drop, wherein the control circuit is to selectively activate the field-effect transistor and in response, enable each of the switchable resistive-divider circuits to permit for measurement of the controlled-load voltage drop.

6. The multi-cell battery apparatus of claim 1, wherein the plurality of voltage-stacked battery cell circuits collectively are to provide a large cell balancing current path for circulating current between one of a multiple primary load terminals to another of the multiple primary load terminals, and wherein the control circuit is to periodically activate each of the switchable resistive-divider circuits without causing a threshold resistance to be added to the large cell balancing current path.

7. The multi-cell battery apparatus of claim 1, wherein the control circuit is to periodically activate each of the switchable resistive-divider circuits and, in response, to measure and report voltage deviations beyond a certain threshold, and wherein in response to the control circuit periodically activating one of the switchable resistive-divider circuits, current drawn from an associated battery cell circuit is less than a threshold to avoid introducing error in the measured voltage deviations.

8. The multi-cell battery apparatus of claim 1, wherein the control circuit is to periodically activate each of the switchable resistive-divider circuits and, in response, to measure and report voltage deviations beyond a certain threshold.

9. The multi-cell battery apparatus of claim 1, wherein the control circuit is to periodically activate each of the switchable resistive-divider circuits and, in response, to measure and report voltage deviations beyond a certain threshold, and wherein in response to each of the switchable resistive-divider circuits not being activated, the upper voltage terminal and the lower voltage terminal are to indicate an open load detection mode through which the control circuit is to confirm, in absence of the control circuit detecting voltage deviations beyond a certain threshold, integrity of the respective voltage-stacked battery cell circuit.

10. The multi-cell battery apparatus of claim 1, each of the voltage-stacked battery cell circuits further including a pair of primary cell terminals coupled to the upper voltage and the lower voltage terminals through respective high-impedance paths, and further including a pair of secondary cell terminals coupled to the upper voltage and the lower voltage terminals through respective high-impedance paths and further coupled to an associated switchable resistive-divider circuit, respectively, wherein in response to an associated one of the switchable resistive-divider circuits not being activated, the pair of secondary cell terminals are to provide a voltage level which is lower than a voltage level of the pair of primary cell terminals to indicate a normal operation mode.

11. The multi-cell battery apparatus of claim 1, further including cell terminal pins, and wherein the plurality of voltage-stacked battery cell circuits and the control circuit are to provide open load detection at the cell terminal pins.

12. The multi-cell battery apparatus of claim 1, wherein the control circuit is to activate periodically each of the switchable resistive-divider circuits and periodically measure associated voltage levels at cell terminal pins and, in response, output data indicative of voltage deviations beyond a certain threshold.

13. The multi-cell battery apparatus of claim 1, further including a common cell battery pin shared by each two consecutive battery cells of the voltage-stacked battery cell circuits.

* * * * *